(12) United States Patent
Hung et al.

(10) Patent No.: US 12,176,914 B2
(45) Date of Patent: Dec. 24, 2024

(54) CONVERSION CIRCUIT FOR CONVERTING SINGLE INPUT TO DIFFERENTIAL INPUT AND SYSTEM CIRCUIT USING THE SAME

(71) Applicant: NUVOTON TECHNOLOGY CORPORATION, Hsinchu (TW)

(72) Inventors: Yeh-Tai Hung, Hsinchu (TW); Wei-Chan Hsu, Hsinchu (TW); Chung Ming Hsieh, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 188 days.

(21) Appl. No.: 18/167,619

(22) Filed: Feb. 10, 2023

(65) Prior Publication Data

US 2023/0403024 A1 Dec. 14, 2023

(30) Foreign Application Priority Data

Jun. 8, 2022 (TW) .................................. 111121332

(51) Int. Cl.
*H03M 1/38* (2006.01)

(52) U.S. Cl.
CPC .................................... *H03M 1/38* (2013.01)

(58) Field of Classification Search
CPC ....... H03M 1/38; H03M 1/1245; H03M 1/468
See application file for complete search history.

(56) References Cited

U.S. PATENT DOCUMENTS

| | | | |
|---|---|---|---|
| 6,624,779 B2 * | 9/2003 | Hochschild | G06G 7/1865 341/172 |
| 6,784,824 B1 * | 8/2004 | Quinn | G06G 7/14 341/172 |
| 7,271,755 B2 * | 9/2007 | Mulder | H03M 1/204 341/172 |
| 7,414,555 B1 * | 8/2008 | Nathawad | H03M 1/1215 341/122 |
| 7,667,501 B2 * | 2/2010 | Surendranath | G11C 27/026 327/554 |
| 8,830,097 B2 * | 9/2014 | Aruga | H03M 3/35 341/172 |
| 9,768,795 B1 * | 9/2017 | Matsumoto | H03M 1/468 |
| 10,069,507 B1 * | 9/2018 | Hoseini | G11C 27/026 |
| 10,630,308 B2 * | 4/2020 | Wu | H03K 5/24 |
| 10,862,497 B1 * | 12/2020 | Lin | H03M 1/1245 |
| 2002/0041244 A1 * | 4/2002 | Gandolfi | H03M 3/502 341/143 |

(Continued)

*Primary Examiner* — Lam T Mai
(74) *Attorney, Agent, or Firm* — MUNCY, GEISSLER, OLDS & LOWE, P.C.

(57) ABSTRACT

An embodiment of the present disclosure provides a conversion circuit for converting a single-ended input to a differential input, which has fewer switches and fewer capacitors. This conversion circuit increases the signal-to-noise ratio (SNR), and the conversion circuit directly uses the higher supply voltage AVDD without being bucked by the regulator, wherein the common mode voltage is AVDD/2N, and N is greater than 1. Overall, not only the circuit area is smaller and the SNR is higher, but also the manufacturing cost is reduced. In addition, compared with the prior art, the conversion circuit of the embodiment of the present disclosure has only three operation periods, so the control is simpler and the operation speed is faster.

18 Claims, 9 Drawing Sheets

(56) References Cited

U.S. PATENT DOCUMENTS

| | | | |
|---|---|---|---|
| 2004/0036453 A1* | 2/2004 | Rossi | H03F 3/005 341/161 |
| 2004/0160351 A1* | 8/2004 | Rossi | H03F 3/005 341/161 |
| 2005/0140535 A1* | 6/2005 | Lee | H03M 1/141 341/156 |
| 2005/0275579 A1* | 12/2005 | Ogita | H03M 1/007 341/161 |
| 2006/0055577 A1* | 3/2006 | Boemler | H04N 25/78 341/155 |
| 2007/0171118 A1* | 7/2007 | Onishi | H03M 3/356 341/172 |
| 2008/0191916 A1* | 8/2008 | Shin | H03M 1/0607 341/144 |
| 2008/0284626 A1* | 11/2008 | Hattori | H04N 25/00 341/172 |
| 2010/0182176 A1* | 7/2010 | Kawahito | H03M 1/00 341/172 |
| 2010/0182177 A1* | 7/2010 | Lin | H03M 1/1014 341/122 |
| 2010/0194615 A1* | 8/2010 | Lu | H03M 3/454 341/155 |
| 2010/0194621 A1* | 8/2010 | Mizoguchi | H04N 25/78 341/172 |
| 2011/0148675 A1* | 6/2011 | Zhao | H03M 1/1033 341/118 |
| 2011/0169676 A1* | 7/2011 | Iriguchi | H03M 3/474 341/143 |
| 2011/0199245 A1* | 8/2011 | Tsai | G11C 27/026 341/122 |
| 2012/0081244 A1* | 4/2012 | Lai | H03M 1/1215 341/122 |
| 2012/0146829 A1* | 6/2012 | Baghini | H03M 1/466 341/161 |
| 2012/0161994 A1* | 6/2012 | Quiquempoix | H03F 3/005 330/69 |
| 2012/0182166 A1* | 7/2012 | Haneda | H03M 1/1061 341/118 |
| 2013/0321184 A1* | 12/2013 | Lin | H03M 1/164 341/110 |
| 2015/0109159 A1* | 4/2015 | Liu | H03M 1/005 341/143 |
| 2016/0359463 A1* | 12/2016 | Kurose | H03F 3/45 |
| 2017/0353685 A1* | 12/2017 | Liu | H03M 1/02 |
| 2018/0269893 A1* | 9/2018 | Chang | H03M 1/0682 |
| 2019/0181876 A1* | 6/2019 | Shim | H03M 1/466 |
| 2020/0028518 A1* | 1/2020 | Wu | H03M 1/442 |
| 2020/0106454 A1* | 4/2020 | Chang | H03M 1/462 |
| 2021/0313998 A1* | 10/2021 | Wang | G05F 1/468 |
| 2022/0029632 A1* | 1/2022 | Kurahashi | H03M 1/167 |
| 2023/0079091 A1* | 3/2023 | Yuan | G09G 3/3275 345/55 |
| 2023/0299787 A1* | 9/2023 | Chang | H03M 3/47 341/143 |
| 2024/0322837 A1* | 9/2024 | Prasad | H03M 1/468 |

\* cited by examiner

CONVERSION CIRCUIT FOR CONVERTING SINGLE INPUT TO DIFFERENTIAL INPUT AND SYSTEM CIRCUIT USING THE SAME

CROSS-REFERENCE TO RELATED APPLICATION

This application claims the priority benefit of Taiwan application serial no. 111121332, filed on Jun. 8, 2022. The full disclosure of which is incorporated herein by reference.

BACKGROUND

Technical Field

The present disclosure relates to a conversion circuit for converting single input to differential input and the system circuit using the same. More particularly, the present disclosure relates to a conversion circuit and system circuit using the same which may reduce the number of components (circuits and switches), directly use the supply voltage without being bucked by a regulator, and have a high signal-to-noise ratio (SNR).

Description of Related Art

An input end of analog-to-digital converter (ADC) is usually a single-ended input, and the voltage is from a high voltage (e.g., a supply voltage VDD_L for a digital circuit) to a low voltage (e.g., a ground voltage GND). In order to speed up the operation of the ADC, the configuration of a low voltage device is usually applied. For example, the range of the input voltage of the device is reduced from 5V to 1.2V. However, both the configuration of the low voltage device and the single-ended input will degrade the signal-to-noise ratio. Moreover, in order to meet the requirement of overstress, a scaling circuit is configured additionally in conventional technology. (usually implemented by an amplifier) Generally speaking, the SNR of the single-ended input is about half of the SNR of differential input.

Refer to FIG. 1, FIG. 1 is a circuit diagram of a system circuit with successive approximation register ADC (SAR ADC) according to the prior art. In FIG. 1, the circuit system 1 includes a conversion circuit 10, an amplifier 12 and a SAR ADC 14. The conversion circuit 10 is electrically connected to the amplifier 12, and the amplifier 12 is electrically connected to the SAR ADC 14. The conversion circuit 10 is configured to convert a single-ended input to differential input which is configured to a positive input end and a negative input end of the amplifier 12 (i.e., positive end input signal and negative end input signal). After the positive end input signal and negative end input signal are amplified by the amplifier 12, a differential amplified signal is outputted to the SAR ADC 14, every bit D_0~D_N of a digital signal is outputted by the SAR ADC 14 based on the differential amplified signal, and a feedback control signal is generated to adjust the capacitance value in the capacitor CA of the conversion circuit 10.

The conversion circuit 10 includes a first conversion sub-circuit 100 and a second conversion sub-circuit 102, and the composition and the structure of the first conversion sub-circuit 100 and the second conversion sub-circuit 102 are similar. The only difference between the two sub-circuits is the signals received by them. The positive input signal VIN_P received by the first conversion sub-circuit 100 is a single-ended input signal, while the negative input signal VIN_N received by the second conversion sub-circuit 102 is a common mode low voltage signal VCM_L.

Each of the first conversion sub-circuit 100 and the second conversion sub-circuit 102 includes capacitors CA and CB, and switches SW1, SW2 and SW3, wherein the switch SW2 is shared by the first conversion sub-circuit 100 and the second conversion sub-circuit 102. The switch SW3 includes a plurality of switch units S0~SN. A switch capacitor includes the capacitor CA and the switch SW3, the switch capacitor is formed from a plurality of switch capacitor units connected in parallel, and every switch capacitor unit includes the switch units connected in series and the corresponding capacitor units. For example, the capacitor unit C0 is corresponding to the switch unit S0, the capacitor unit C1 is corresponding to the switch unit S1, and so on. The capacitance value of the capacitor unit CA is determined by the switch states of switch units S0~SN in the switch SW3.

There are four operation periods for the conversion circuit. Refer to FIG. 2, and FIG. 2 is an equivalent circuit diagram of the conversion circuit in FIG. 1 during the first operation period. During the first operation period, by the action of switches SW1, SW2 and SW3, the input voltage VIN is received by the first end of the capacitor CA, the second end of the capacitor CB is electrically connected to the supply voltage VDD_L (the supply voltage VDD_L is a lower supply voltage generated after a higher supply voltage AVDD is bucked by the regulator), and the second end of the capacitor CA and the first end of the capacitor CB are electrically connected to the supply voltage VDD_L, wherein the input voltage VIN is corresponding to the positive input signal VIN_P (single-ended input signal) in the first conversion sub-circuit 100 and the negative input signal VIN_N (common mode low voltage signal VCM_L) in the first conversion sub-circuit 102 respectively. At this moment, a voltage stress between the two ends of the capacitor CA is VCA=VDD_L−VIN, the voltage stress between the two ends of the capacitor CB is VCB=0, the voltage stress between the two ends of the capacitor CC is VCC=VDD_L, and the voltage of the signal VIN_CMP inputted to the amplifier 12 is VDD_L.

Then, refer to FIG. 3, and FIG. 3 is an equivalent circuit diagram of the conversion circuit in FIG. 1 during the second operation period. During the second operation period after the first operation period, not as that during the first operation period, the switch SW1 is configured to control the second end of the capacitor CA and the first end of the capacitor CB to be floating, and the total charge of the capacitors CA and CC is CA*(VDD_L−VIN)+CC*VDD_L.

Then, refer to FIG. 4, and FIG. 4 is an equivalent circuit diagram of the conversion circuit in FIG. 1 during the third operation period. During the third operation period after the second operation period, not as that during the second operation period, the switch SW2 is configured to control the second end of the capacitor CB to receive the ground voltage GND. Thus, the charge is redistributed. Because the capacitors CA, CB and CC are designed to satisfy a relational equation CA+CC=CB, the voltage stress of two ends of the capacitor CA is VCA=VDD_L/2−VIN, the voltage stress of two ends of the capacitor CB is VCB=VDD_L/2, the voltage stress of two ends of the capacitor CB is VCC=VDD_L/2, and the voltage of the signal VIN_CMP inputted to the amplifier 12 is VDD_L/2.

Furthermore, refer to FIG. 5, and FIG. 5 is an equivalent circuit diagram of the conversion circuit in FIG. 1 during the fourth operation period. During the fourth operation period after the third operation period, not as that during the third operation period, the switch SW3 is configured to control the first end of the capacitor CA to receive the ground voltage GND. Thus, the charge is redistributed. Because the capacitors CA, CB and CC are designed to satisfy a relational equation CA/(CA+CB+CC)=1/N (N>1), the voltage stress of two ends of the capacitor CA is VCA=VDD_L/2−VIN/N, the voltage stress of two ends of the capacitor CB is VDD_L/2−VIN/N, the voltage stress of two ends of the capacitor CB is VCC=VDD_L/2−VIN/N, and the voltage of the signal VIN_CMP inputted to the amplifier 12 is VCC=VDD_L/2−VIN/N.

At the last, it is to be known that the positive end input signal of the amplifier 12 is VDD_L/2−VIN_P/N, the negative end input signal of the amplifier 12 is VDD_L/2−VIN_N/N. The difference between the positive end input signal and the negative end input signal is equal to the difference between the common mode low voltage signal VCM_L(VCM_L=VDD_L/2) and the single-ended input signal. Accordingly, the SNR of the positive input signal and the negative input signal outputted by the conversion circuit 10 is still the SNR of the single-ended input. Moreover, in the circuit described above, the number of the switches and that of the capacitors are over 6, and it is necessary to use the lower supply voltage VDD_L, which is generated after a higher supply voltage VDD is bucked by the regulator. Thus, there is still room for improvement.

SUMMARY

A conversion circuit for converting a single-ended input to a differential input is provided in the embodiments of the present disclosure, the conversion circuit is adapted to a signal convertor, and the signal convertor includes a first capacitor, a second capacitor, a third capacitor, a fourth capacitor, a first switch, a second switch, a third switch, and a fourth switch. Each of the first to fourth capacitors includes a first end and a second end, wherein the second end of the first capacitor is electrically connected to the first end of the second capacitor, the second end of the second capacitor is electrically connected to the first end of the fourth capacitor, the second end of the second capacitor and the first end of the fourth capacitor are electrically connected to a low voltage, the second end of the fourth capacitor is electrically connected to the first end of the third capacitor, the second end of the first capacitor and the first end of the second capacitor are configured to output a first end input signal to the signal converter, and the second end of the fourth capacitor and the first end of the third capacitor are configured to output a second end input signal to the signal converter. The first switch is electrically connected to the second end of the first capacitor and the first end of the second capacitor, the second switch is electrically connected to the first end of the first capacitor, the third switch is electrically connected to the second end of the fourth capacitor and the first end of the third capacitor, and the fourth switch is electrically connected to the second end of the third capacitor.

Further, the first switch is configured to selectively control the second end of the first capacitor and the first end of the second capacitor to receive the low voltage or be floating based on a first switch control signal. The third switch is configured to selectively control the second end of the fourth capacitor and the first end of the third capacitor to receive the low voltage or be floating based on the first switch control signal. The second switch is configured to selectively control the first end of the first capacitor to receive the low voltage or an input voltage based on a second switch control signal. The fourth switch is configured to selectively control the second end of the third capacitor to receive the input voltage or a first supply voltage based on the second switch control signal.

Another conversion circuit for converting a single-ended input to a differential input is provided in the embodiments of the present disclosure, the conversion circuit is adapted to a signal converter, and the conversion circuit includes a first conversion sub-circuit and a second conversion sub-circuit. The first conversion sub-circuit includes a plurality of switches and a plurality of capacitors, the first conversion sub-circuit is configured to selectively receive a low voltage or an input voltage, and configured to output a first switch control signal to the signal converter. The second conversion sub-circuit includes a plurality of switches and a plurality of capacitors, the second conversion sub-circuit is electrically connected to the first conversion sub-circuit via the low voltage, and the second conversion sub-circuit is configured to selectively receive the input voltage or a first supply voltage, and configured to output a second end input signal to the signal converter. During a first operation period, the first end input signal and the second end input signal are controlled to be the low voltage by the plurality of switches of the first conversion sub-circuit and the second conversion sub-circuit. During a second operation period after the first operation period, the plurality of switches of the first conversion sub-circuit and the second conversion sub-circuit are operated to make a total quantity of electric charge of the capacitors of the first conversion sub-circuit zero and make the total quantity of electric charge of the capacitors of the second conversion sub-circuit is controlled be a product of the capacitance value of one of the capacitors of the second conversion sub-circuit and the input voltage. During a third operation period after the second operation period, the plurality of switches of the first conversion sub-circuit and the second conversion sub-circuit are operated to redistribute the charges of the plurality of capacitors of the first conversion sub-circuit to make the first end input signal be 1/N times of an input signal, and redistribute the charges of the plurality of capacitors of the second conversion sub-circuit to make the second end input signal be 1/N times of the difference between the first supply voltage minus the input voltage.

A circuit system is provided in the embodiments of the present disclosure, and the circuit system includes the conversion circuit, the signal converter and a function circuit, wherein the signal converter is electrically connected to the conversion circuit, and the function circuit is electrically connected to the signal converter.

In summary, compared to the prior art, the conversion circuit provided in the embodiments of the present disclosure has the advantageous of utilizing fewer switches, fewer capacitors, higher SNR, directly utilizing higher supply voltage AVDD which is not be bucked by the regulator, and higher operation speed.

In order to further understand the technology, means, and effects of the present disclosure, reference may be made by the detailed description and drawing as follows. Accordingly, the purposes, features and concepts of the present disclosure can be thoroughly and concretely understood. However, the following detailed description and drawings are only used to reference and illustrate the implementation of the present disclosure, and they are not used to limit the present disclosure.

BRIEF DESCRIPTION OF THE DRAWINGS

The accompanying drawings are provided to enable person having ordinary skill in the art can further understand the present disclosure, and the accompanying drawings are incorporated in and constitute a part of the specification of the present disclosure. The drawings illustrate exemplary embodiments of the present disclosure, and the description in the specification of the present disclosure is served to explain together the principal of the present disclosure.

DETAILED DESCRIPTION

Figure 1:
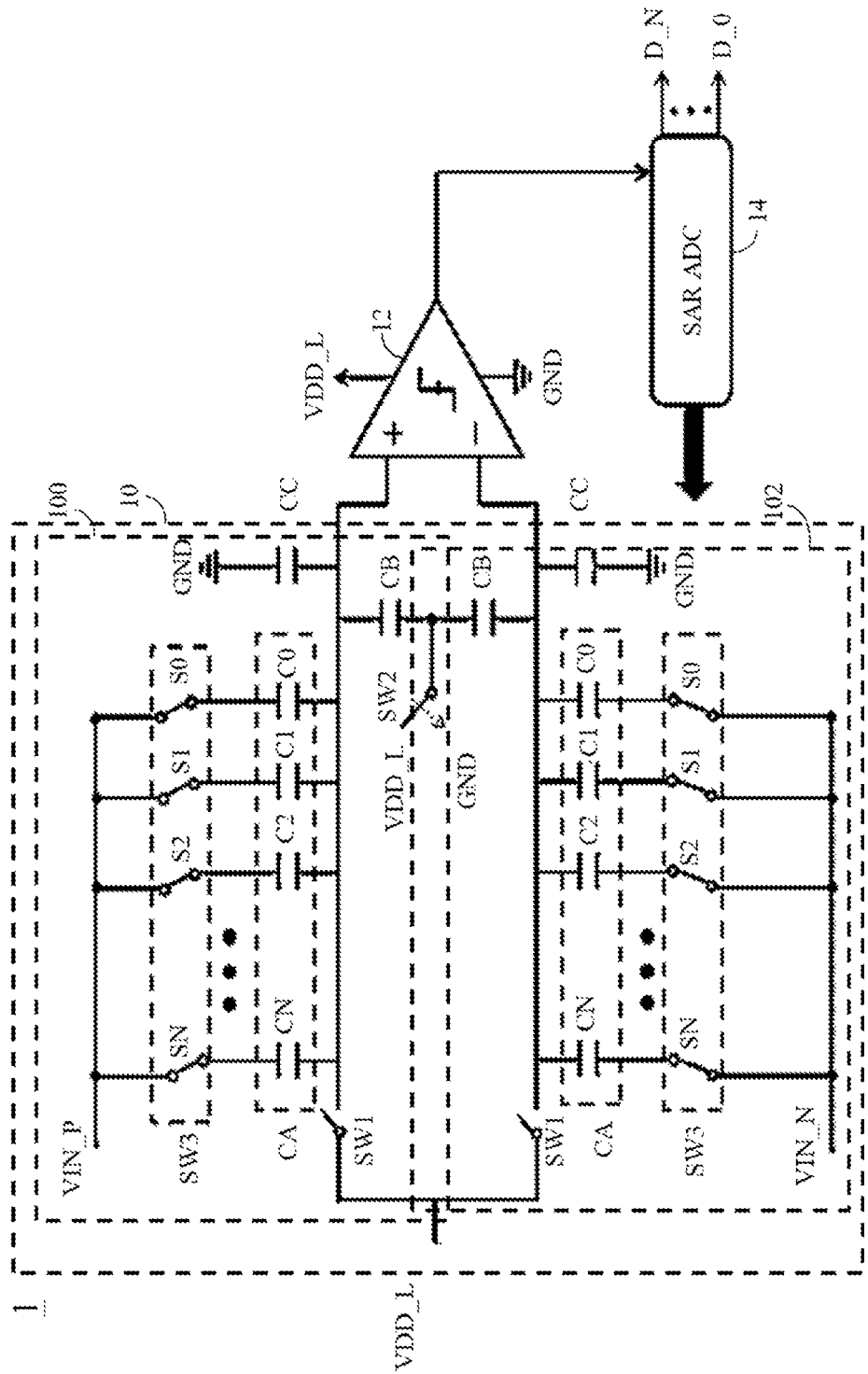
FIG. 1 is a circuit diagram of a system circuit with successive approximation register ADC in the prior art.
Figure 2:
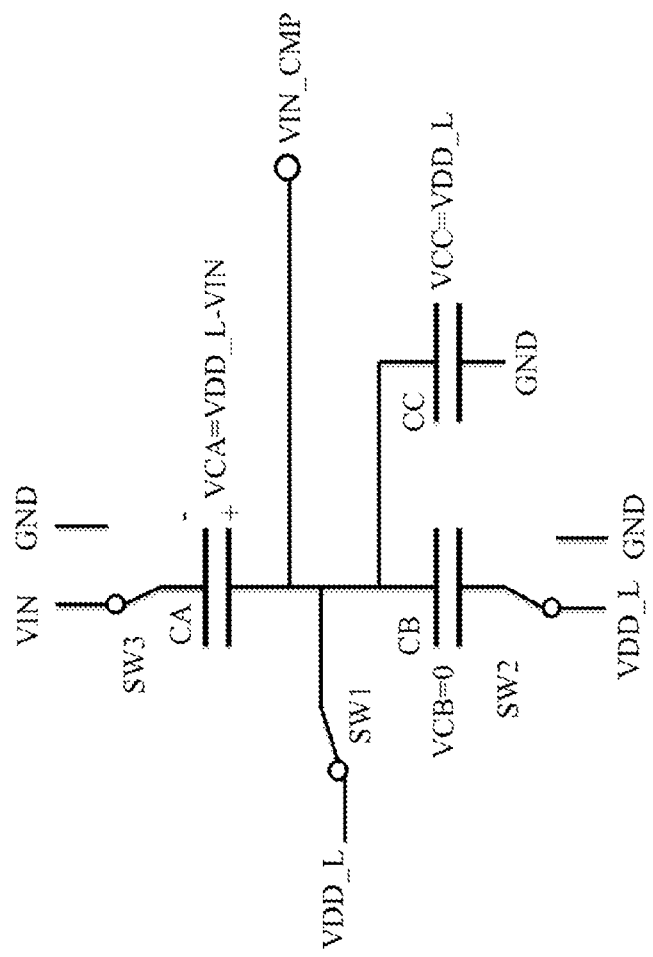
FIG. 2 is an equivalent circuit diagram of the conversion circuit in FIG. 1 during the first operation period.
Figure 3:
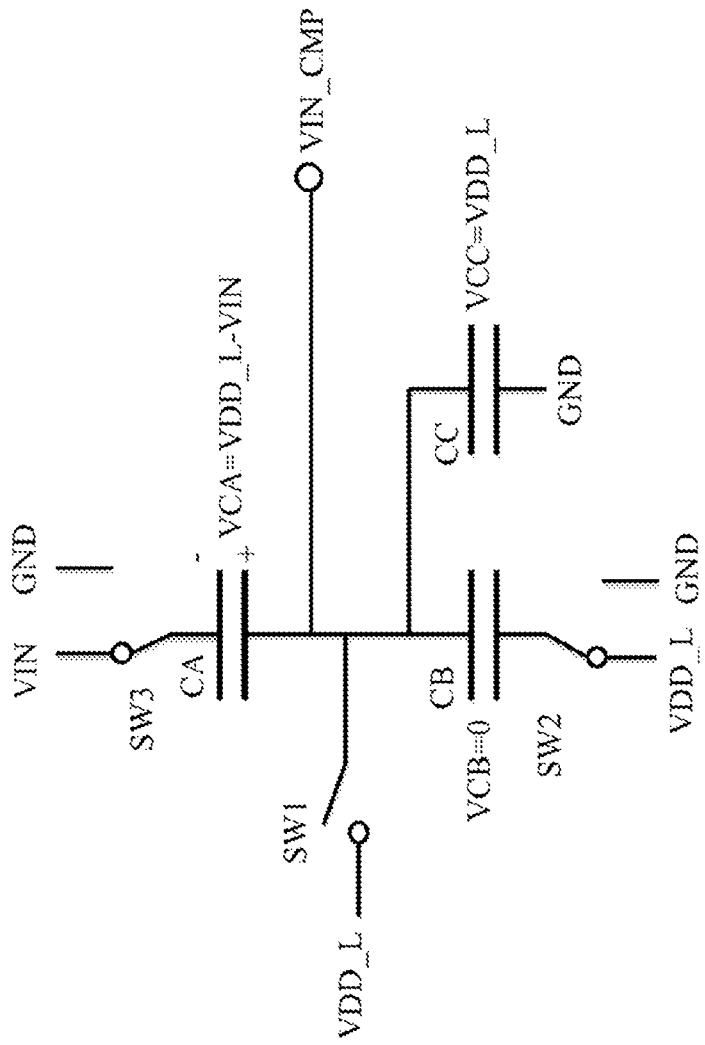
FIG. 3 is an equivalent circuit diagram of the conversion circuit in FIG. 1 during the second operation period.
Figure 4:
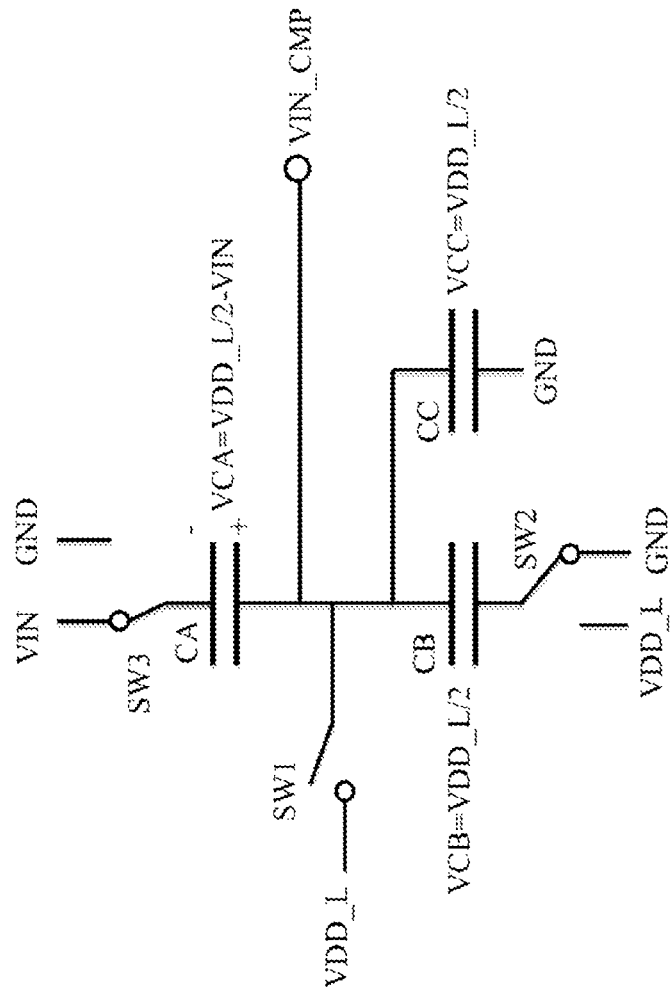
FIG. 4 is an equivalent circuit diagram of the conversion circuit in FIG. 1 during the third operation period.
Figure 5:
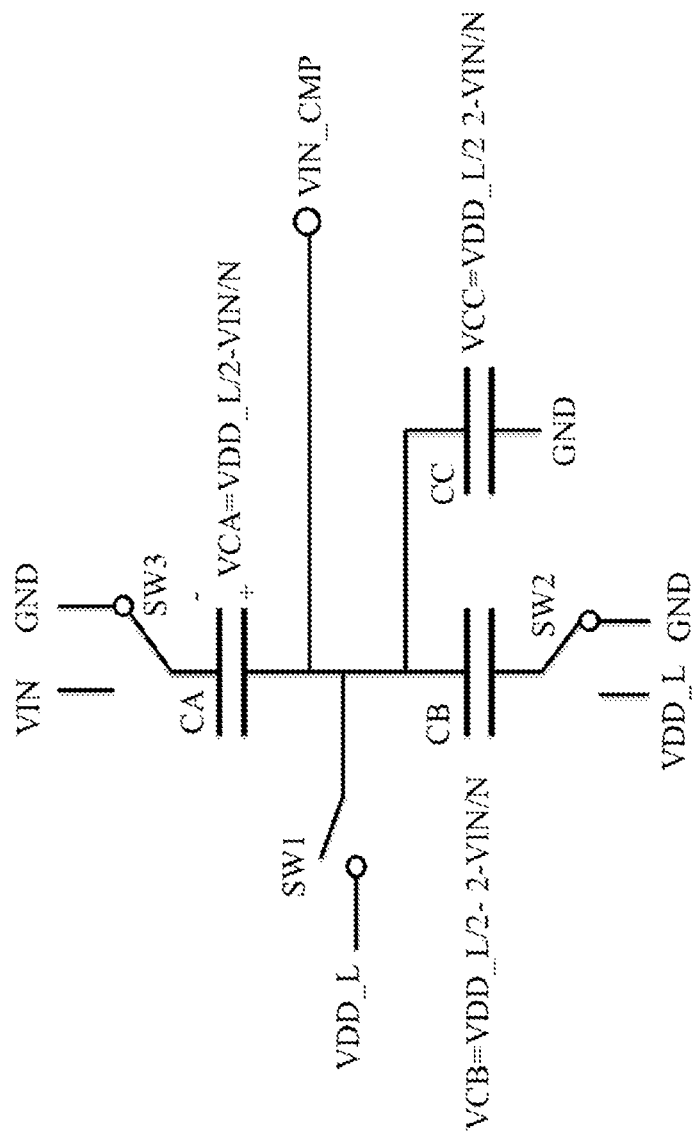
FIG. 5 is an equivalent circuit diagram of the conversion circuit in FIG. 1 during the fourth operation period.

Reference will now be made in detail to exemplary embodiments of the present disclosure, exemplary embodiments of which are illustrated in the accompanying drawings. Wherever possible, the same element number is used in the drawings and the description to refer to the same or the similar part. Furthermore, exemplary embodiments are only one of implemental ways in the concept of design of the present disclosure, none of exemplars described below is intended to limit the present disclosure.

Compared to the prior art, a conversion circuit with fewer switches and capacitors is provided in the embodiments of the present disclosure. The conversion circuit has higher SNR, and the conversion circuit directly uses higher supply voltage AVDD without being bucked by the regulator, wherein a common mode voltage is AVDD/2N, and N is greater than 1. Overall, not only the circuit area is reduced and SNR is higher, but also the manufacturing cost is saved. Also, compared to the prior art, the number of the operation period of the conversion circuit in the embodiments of the present disclosure is only three. Thus, the control is simple, and the operation speed is fast.

Moreover, the conversion circuit includes a first conversion sub-circuit and a second conversion sub-circuit. The first conversion sub-circuit is configured to output a first end input signal to the signal converter. For example, an amplifier or a comparator, but the present disclosure is not limited thereto. Any circuit which generated an output signal based on the first end input signal and the second end input signal is suitable for the present disclosure. Besides, the first conversion sub-circuit includes a plurality of switches and a plurality of capacitors. For instance, it may have two capacitors and two switches. The first conversion sub-circuit is configured to selectively receive a low voltage (e.g., a ground voltage) or an input voltage. The second conversion sub-circuit is configured to output a second end input signal to the signal converter, and the second conversion sub-circuit includes a plurality of switches and a plurality of capacitors. For instance, it may have two capacitors and two switches. The first conversion sub-circuit and the second conversion sub-circuit are electrically connected to each other via the low voltage. The second conversion sub-circuit is configured to selectively receive the input voltage or a supply voltage which is not be bucked. The capacitance values of two capacitors in the second conversion sub-circuit are respectively the same as those of two capacitors in the first conversion sub-circuit. Further, the capacitance value of one capacitor in the first conversion sub-circuit is 1/N times of the total capacitance values of two capacitors.

During a first operation period of the conversion circuit, the first switch control signal and the second switch control signal are controlled to be the low voltage by the switches of the first conversion sub-circuit and the second conversion sub-circuit. During a second operation period of the conversion circuit after the first operation period, the plurality of switches of the first conversion sub-circuit and the second conversion sub-circuit are operated to make a total charge of the capacitors of the first conversion sub-circuit zero and make the total charge of the capacitors of the second conversion sub-circuit be a product of the capacitance value of one capacitor in the second conversion sub-circuit. During a third operation period of the conversion circuit after the second operation period, the plurality of switches of the first conversion sub-circuit and the second conversion sub-circuit are operated to redistribute the charges of the capacitors of the first conversion sub-circuit to make the first end input signal be 1/N times of an input signal, and redistribute the charges of the capacitors of the second conversion sub-circuit to make the second end input signal be 1/N times of the difference of the supply voltage minus the input voltage, wherein the supply voltage is not be bucked.

Figure 6:
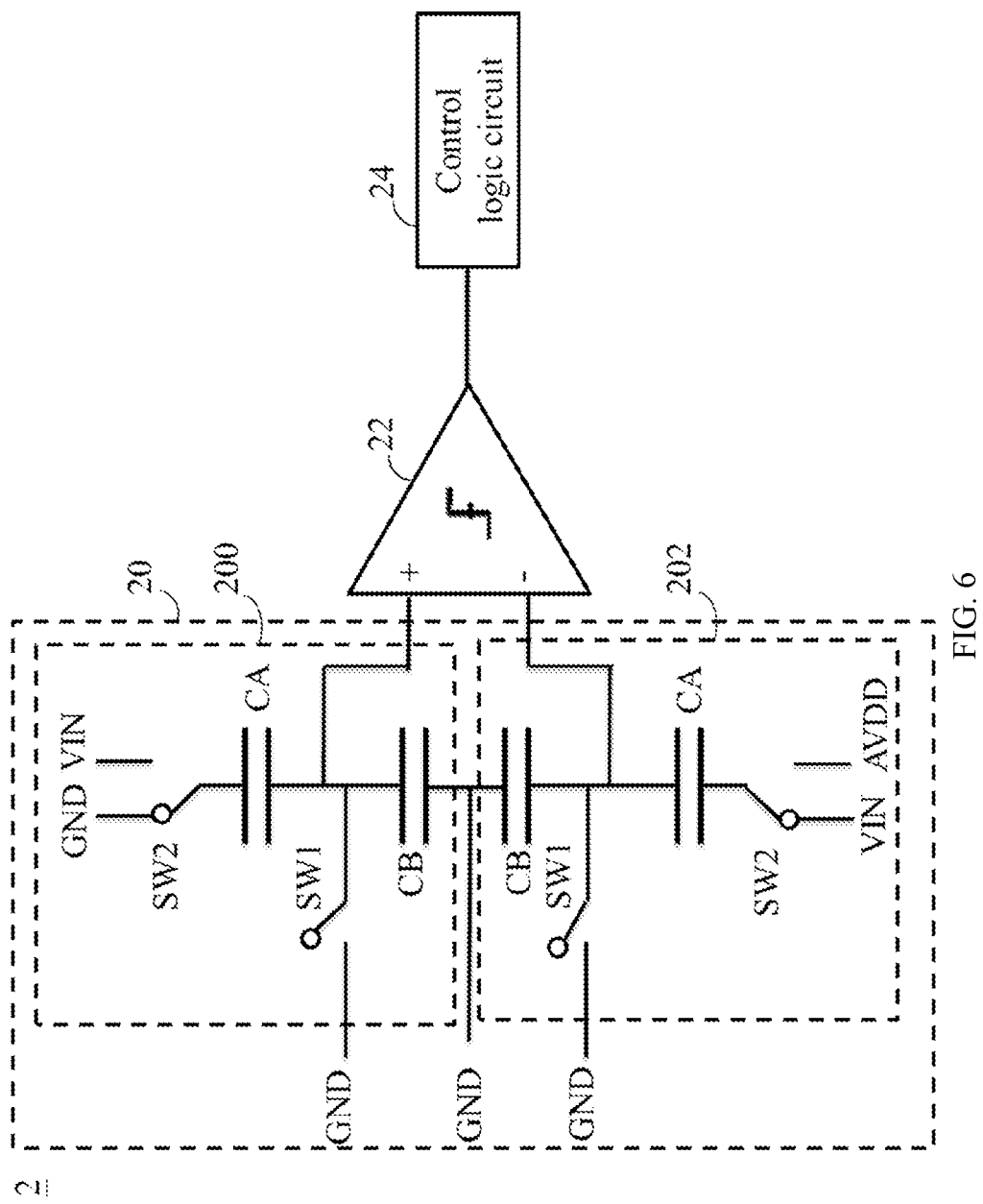
FIG. 6 is a circuit diagram of a conversion circuit for converting single input to differential input according to an embodiment of the present disclosure.

In order to implement the conversion circuit described above, one detailed design of the conversion circuit in the present disclosure is further introduced. Refer to FIG. 6, FIG. 6 is a circuit diagram of a conversion circuit for converting single input to differential input according to an embodiment of the present disclosure. A circuit system 2 includes a conversion circuit 20, a signal converter 22 and a control logic circuit 24, wherein the signal converter 22 may be an amplifier or a comparator in this embodiment. The conversion circuit 20 is electrically connected to the signal converter 22, and the signal converter 22 is electrically connected to the control logic circuit 24. The conversion circuit 20 is configured to convert a single-ended input to a differential input, wherein the differential input is used in a first input end and a second input end of the signal converter 22 (i.e., a first end input signal and a second end input signal). After a difference value of the first end input signal and the second end input signal is amplified by the signal converter 22, an amplified differential signal is outputted to the control logic circuit 24. Based on the amplified differential signal, a corresponding control signal or a corresponding logic signal is generated by the control logic circuit 24.

The control logic circuit 24 may be replaced with other types of function circuits. For example, a SAR ADC or an integrating circuit, and the present disclosure is not limited thereto. When the SAR ADC is selected as the function circuit, a switch capacitor includes the capacitor CA and the switch SW2 in FIG. 6, the switch capacitor includes a plurality of switch capacitor units connected in parallel, and each of the switch capacitor units includes a switch unit and a capacitor unit connected in series, wherein the capacitance values of the capacitor units in the switch capacitor unit may be all the same, all different, or partially different. For the implementation of the switch capacitor may refer to the capacitor CA and the switch SW3 in FIG. 1, the capacitor CA includes the capacitor units C0~CN, and the switch SW3 includes the switch units S0~SN. Here are not described in detail.

The conversion circuit 20 includes a first conversion sub-circuit 200 and a second conversion sub-circuit 202, the first conversion sub-circuit 200 and the second conversion sub-circuit 202 are electrically connected to each other via the ground voltage GND. Each of the first conversion sub-circuit 200 and the second conversion sub-circuit 202 includes capacitors CA and CB, and switches SW1 and SW2.

The second end of the capacitor CA in the first conversion sub-circuit 200 is electrically connected to the first end of the capacitor CB in the first conversion sub-circuit 200. The second end of the capacitor CB in the first conversion sub-circuit 200 is electrically connected to the first end of the capacitor CB in the second conversion sub-circuit 202. The second end of the capacitor CB in the first conversion sub-circuit and the first end of the capacitor CB in the second conversion sub-circuit 202 are electrically connected to the ground voltage GND. The second end of the capacitor CB in the second conversion sub-circuit 202 is electrically connected to the first end of the capacitor CA in the second conversion sub-circuit 202. The second end of the capacitor CA in the first conversion sub-circuit 200 and the first end of the capacitor CB in the first conversion sub-circuit 200 are configured to output the first end input signal to the signal convertor 22, and the second end of the capacitor CB in the second conversion sub-circuit 202 and the first end of the capacitor CA in the second conversion sub-circuit 202 are configured to output the second end input signal to the signal convertor 22.

The switch SW1 in the first conversion sub-circuit 200 is electrically connected to the second end of the capacitor CA in the first conversion sub-circuit 200 and the first end of the capacitor CB in the first conversion sub-circuit 200. The switch SW2 in the first conversion sub-circuit 200 is electrically connected to the first end of the capacitor CA in the first conversion sub-circuit 200. The switch SW1 in the second conversion sub-circuit 202 is electrically connected to the second end of the capacitor CB in the second conversion sub-circuit 202 and the first end of the capacitor CA in the second conversion sub-circuit 202. The switch SW2 in the second conversion sub-circuit 202 is electrically connected to the second end of the capacitor CA in the second conversion sub-circuit 202.

Figure 7:
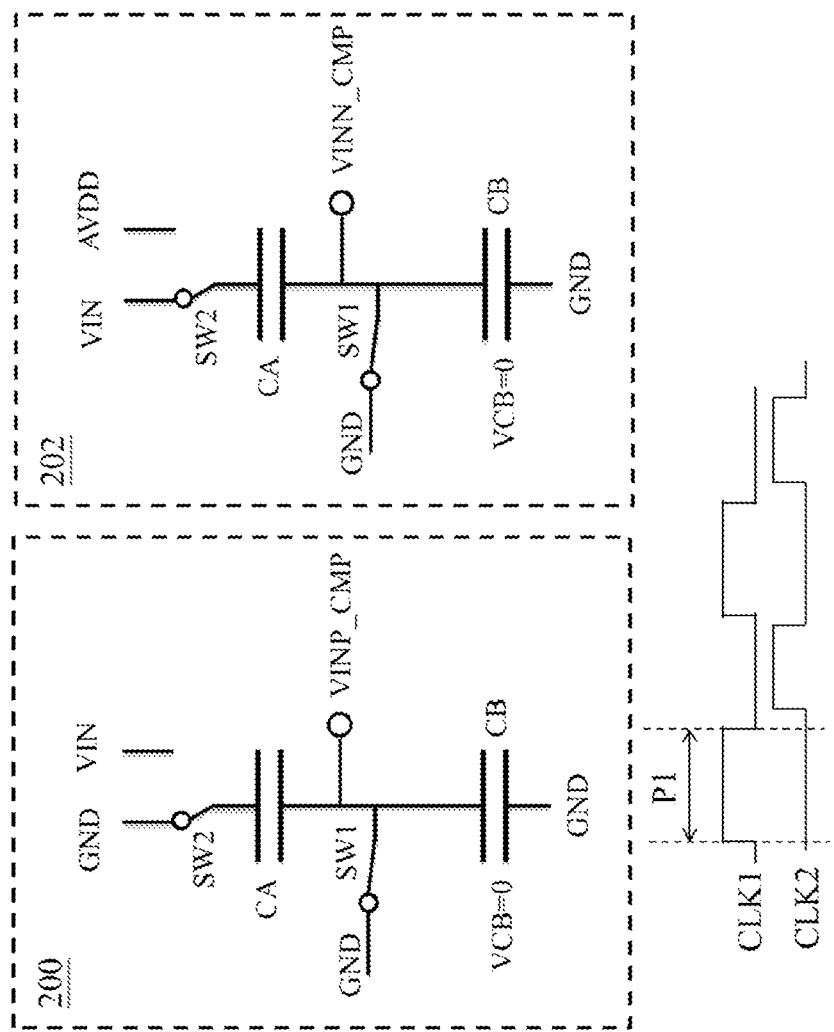
FIG. 7 is an equivalent circuit diagram of the conversion circuit in FIG. 6 during the first operation period.
Figure 8:
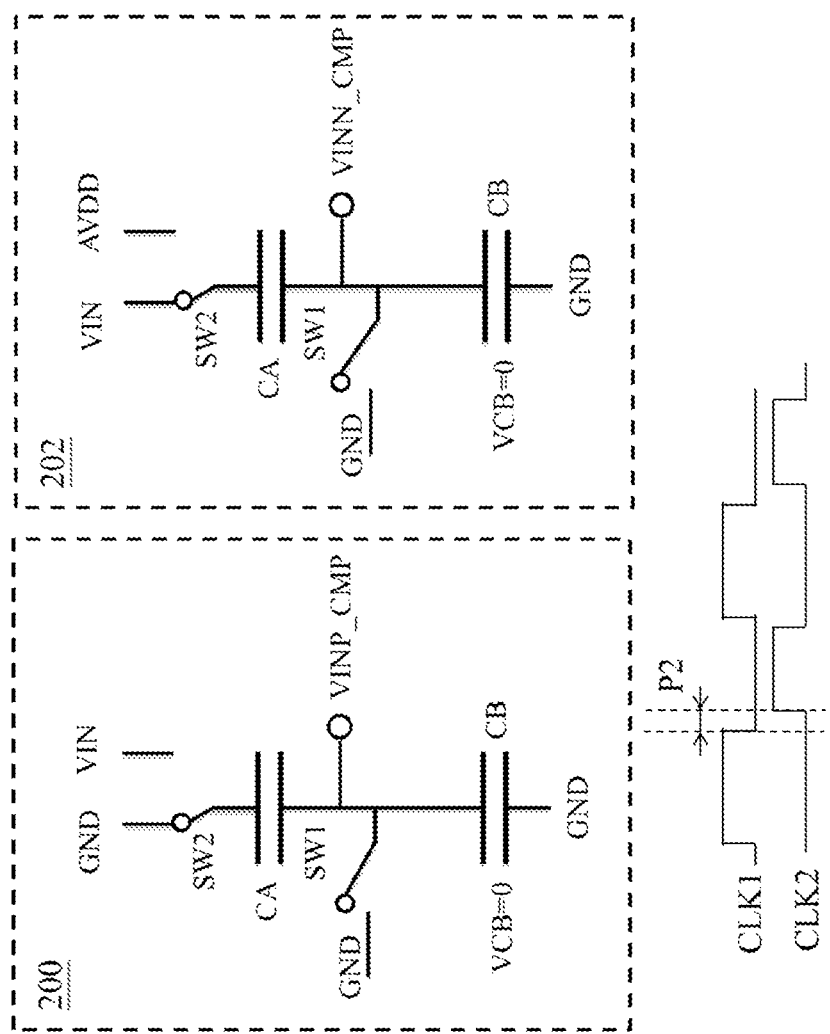
FIG. 8 is an equivalent circuit diagram of the conversion circuit in FIG. 6 during the second operation period.
Figure 9:
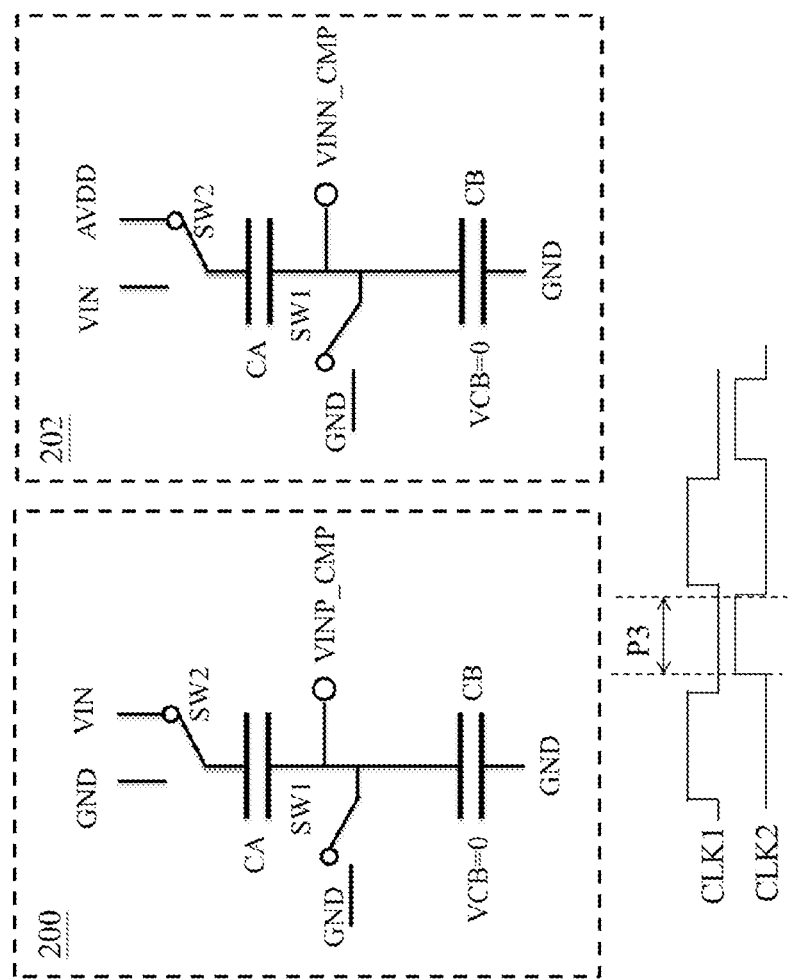
FIG. 9 is an equivalent circuit diagram of the conversion circuit in FIG. 6 during the third operation period.

Based on a first control signal CLK1 shown in FIG. 7 to FIG. 9, the switch SW1 in the first conversion sub-circuit 200 is configured to selectively control the second end of the capacitor CA in the first conversion sub-circuit 200 and the first end of the capacitor CB in the first conversion sub-circuit 200 to receive the ground voltage GND or be floating. Based on the first control signal CLK1 shown in FIG. 7 to FIG. 9, the switch SW1 in the second conversion sub-circuit 202 is configured to selectively control the second end of the capacitor CB in the second conversion sub-circuit 202 and the first end of the capacitor CA in the second conversion sub-circuit 202 to receive the ground voltage GND or be floating. Based on a second control signal CLK2 shown in FIG. 7 to FIG. 9, the switch SW2 in the first conversion sub-circuit 200 is configured to selectively control the first end of the capacitor CA in the first conversion sub-circuit 200 to receive the ground voltage GND or the input voltage VIN. Based on the second control signal CLK2 shown in FIG. 7 to FIG. 9, the switch SW2 in the second conversion sub-circuit 202 is configured to selectively control the second end of the capacitor CA in the second conversion sub-circuit 202 to receive the input voltage VIN or the supply voltage AVDD which is not be bucked, wherein the input voltage VIN is smaller than the supply voltage AVDD which is not be bucked. The signal converter 22 receives the supply voltage VDD_L which is bucked to be as a power, and the supply voltage VDD_L which is bucked is smaller than the supply voltage AVDD which is not be bucked.

Refer to FIG. 7, and FIG. 7 is an equivalent circuit diagram of the conversion circuit in FIG. 6 during the first operation period. During a first operation period P1 and based on the first control signal CLK1, the switch SW1 in the first conversion sub-circuit 200 is configured to control the second end of the capacitor CA in the first conversion sub-circuit 200 and the first end of the capacitor CB in the first conversion sub-circuit 200 to receive the ground voltage GND. Based on the first control signal CLK1, the switch SW1 in the second conversion sub-circuit 202 is configured to control the second end of the capacitor CB in the second conversion sub-circuit 202 and the first end of the capacitor CA in the second conversion sub-circuit 202 to receive the ground voltage GND. Based on a second control signal CLK2, the switch SW2 in the first conversion sub-circuit 200 is configured to control the first end of the capacitor CA in the first conversion sub-circuit 200 to receive the ground voltage GND. Based on the second control signal CLK2, the switch SW2 in the second conversion sub-circuit 202 is configured to control the second end of the capacitor CA in the second conversion sub-circuit 202 to receive the input voltage VIN.

During the first operation period P1, the voltage stress VCB of the capacitor CB in the first conversion sub-circuit 200 and the voltage stress VCB of the capacitor CB in the second conversion sub-circuit 202 are zero (VCB=0), and no charge is stored. Due to both the first end input signal VINP_CMP and the second end input signal VINN_CMP are electrically connected to the ground voltage GND via the switch SW1, the first end input signal VINP_CMP and the second end input signal VINN_CMP are the ground voltage. During the first operation period P1, both the first end and the second end of the capacitor CA in the first conversion sub-circuit 200 are electrically connected to the ground voltage GND, so that the voltage stress VCA of the capacitor CA in the first conversion sub-circuit 200 is zero. However, the first end and the second end of the capacitor CA in the second conversion sub-circuit 202 are respectively electrically connected to the ground voltage GND and the input voltage VIN, so that the voltage stress VCA of the capacitor CA in the second conversion sub-circuit 202 is the input voltage VIN.

Refer to FIG. 8, and FIG. 8 is an equivalent circuit diagram of the conversion circuit in FIG. 6 during the second operation period. During the second operation period P2 after the first operation period P1, based on the first control signal CLK1, the switch SW1 in the first conversion sub-circuit 200 is configured to control the second end of the capacitor CA in the first conversion sub-circuit 200 and the first end of the capacitor CB in the first conversion sub-circuit 200 to be floating. Based on the first control signal CLK1, the switch SW1 in the second conversion sub-circuit 202 is configured to control the second end of the capacitor CB in the second conversion sub-circuit 202 and the first end of the capacitor CA in the second conversion sub-circuit 202 to be floating. Based on the second control signal CLK2, the switch SW2 in the first conversion sub-circuit 200 is configured to control the first end of the capacitor CA in the first conversion sub-circuit 200 to receive the ground voltage GND. Based on the second control signal CLK2, the switch SW2 in the second conversion sub-circuit 202 is configured to control the second end of the capacitor CA in the second conversion sub-circuit 202 to receive the input voltage VIN.

During the second operation period P2, the charges of the capacitor CA and capacitor CB in the first conversion sub-circuit 200 are zero, so that the total charge of the first conversion sub-circuit 200 is zero. Also, the charges of the capacitor CA and capacitor CB in the second conversion sub-circuit 202 are respectively VIN*CA and zero, so that the total charge of the second conversion sub-circuit 202 is VIN*CA. In this period, the first end input signal VINP_CMP and the second end input signal VINN_CMP are respectively the ground voltage GND.

Refer to FIG. 9, and FIG. 9 is an equivalent circuit diagram of the conversion circuit in FIG. 6 during the third operation period. During the third operation period P3 after the second operation period P2, based on the first control signal CLK1, the switch SW1 in the first conversion sub-circuit 200 is configured to control the second end of the capacitor CA in the first conversion sub-circuit 200 and the first end of the capacitor CB in the first conversion sub-circuit 200 to be floating. Based on the first control signal CLK1, the switch SW1 in the second conversion sub-circuit 202 is configured to control the second end of the capacitor CB in the second conversion sub-circuit 202 and the first end of the capacitor CA in the second conversion sub-circuit 202 to be floating. Based on the second control signal CLK2, the switch SW2 in the first conversion sub-circuit 200 is configured to control the first end of the capacitor CA in the first conversion sub-circuit 200 to receive the input voltage VIN. Based on the second control signal CLK2, the switch SW2 in the second conversion sub-circuit 202 is configured to control the second end of the capacitor CA in the second conversion sub-circuit 202 to receive the supply voltage AVDD which is not be bucked.

During the third operation period P3, the charges of the capacitors CA, CB in the first conversion sub-circuit 200 are redistributed, but the total charge is still zero. Also, the charges of the capacitors CA, CB in the second conversion sub-circuit 202 are redistributed, but the total charge is still CA*VIN. The design of the capacitance value of the capacitor CA in the first conversion sub-circuit 200 is the same as the capacitance value of the capacitor CA in the second conversion sub-circuit 202, and the design of the capacitance value of the capacitor CB in the first conversion sub-circuit 200 is the same as the capacitance value of the capacitor CB in the second conversion sub-circuit 202. Thus, the capacitor CA and CB is satisfied the equation CA/(CA+CB)=(1/N), wherein N is greater than 1. That is, the total value of the capacitance value of the capacitor CA and CB is N times of the capacitance value of the capacitor CA. By the design described above, the first end input signal VINP_CMP is 1/N times of the input voltage, and the second end input signal VINN_CMP is 1/N times of the voltage difference of the supply voltage AVDD which is not bucked by minus the input voltage VIN. Therefore, the performance of the SNR is the performance of the differential input, and the common mode voltage is AVDD/2N.

In summary, compared to the prior art, the conversion circuit provided in the embodiments of the present disclosure has the advantageous of fewer switches, fewer capacitors, higher SNR, directly using higher supply voltage AVDD which is not be bucked by the regulator. Therefore, the conversion circuit provided in the embodiments of the present disclosure not only saves the manufacturing cost, but also has higher performance. Thus, it has great commercial value.

All examples and embodiments in the present disclosure are only used to state the purpose. The modifications or changes based on the present disclosure will be suggested to those skilled in the art, and are be included in the essence, the scope, and the scope of the appended claims in the present disclosure.

What is claimed is:

1. A conversion circuit for converting a single-ended input to a differential input, wherein the conversion circuit is adapted to a signal converter, and the conversion circuit comprises:
   a first capacitor, a second capacitor, a third capacitor, and a fourth capacitor, wherein each of the first to fourth capacitors has a first end and a second end,
      the second end of the first capacitor is electrically connected to the first end of the second capacitor,
      the second end of the second capacitor is electrically connected to the first end of the fourth capacitor,
      the second end of the second capacitor and the first end of the fourth capacitor are electrically connected to a low voltage,
      the second end of the fourth capacitor is electrically connected to the first end of the third capacitor,
      the second end of the first capacitor and the first end of the second capacitor are configured to output a first end input signal to the signal converter, and
      the second end of the fourth capacitor and the first end of the third capacitor are configured to output a second end input signal to the signal converter; and
   a first switch, a second switch, a third switch, and a fourth switch, wherein
      the first switch is electrically connected to the second end of the first capacitor and the first end of the second capacitor,
      the second switch is electrically connected to the first end of the first capacitor,
      the third switch is electrically connected to the second end of the fourth capacitor and the first end of the third capacitor, and
      the fourth switch is electrically connected to the second end of the third capacitor;
   wherein
   the first switch is configured to selectively control the second end of the first capacitor and the first end of the second capacitor to receive the low voltage or be floating based on a first switch control signal,
   the third switch is configured to selectively control the second end of the fourth capacitor and the first end of the third capacitor to receive the low voltage or be floating based on the first switch control signal,
   the second switch is configured to selectively control the first end of the first capacitor to receive the low voltage or an input voltage based on a second switch control signal, and
   the fourth switch is configured to selectively control the second end of the third capacitor to receive the input voltage or a first supply voltage based on the second switch control signal.

2. The conversion circuit of claim 1, wherein
   the input voltage is lower than or be equal to the first supply voltage,
   the signal converter receives a second supply voltage as a power source, and
   the second supply voltage is lower than the first supply voltage.

3. The conversion circuit of claim 1, wherein
during a first operation period, the first switch is configured to control the second end of the first capacitor and the first end of the second capacitor to receive the low voltage based on the first switch control signal,
the third switch is configured to control the second end of the fourth capacitor and the first end of the third capacitor to receive the low voltage based on the first switch control signal,
the second switch is configured to control the first end of the first capacitor to receive the low voltage based on the second switch control signal, and
the fourth switch is configured to control the second end of the third capacitor to receive the input voltage based on the second switch control signal.

4. The conversion circuit of claim 3, wherein
during a second operation period after the first operation period,
the first switch is configured to control the second end of the first capacitor and the first end of the second capacitor to be floating based on the first switch control signal,
the third switch is configured to control the second end of the fourth capacitor and the first end of the third capacitor to be floating based on the first switch control signal,
the second switch is configured to control the first end of the first capacitor to receive the low voltage based on the second switch control signal, and
the fourth switch is configured to control the second end of the third capacitor to receive the input voltage based on the second switch control signal.

5. The conversion circuit of claim 4, wherein
during a third operation period after the second operation period,
the first switch is configured to control the second end of the first capacitor and the first end of the second capacitor be floating based on the first switch control signal,
the third switch is configured to control the second end of the fourth capacitor and the first end of the third capacitor be floating based on the first switch control signal,
the second switch is configured to control the first end of the first capacitor to receive the input voltage based on the second switch control signal, and
the fourth switch is configured to control the second end of the third capacitor to receive the first supply voltage based on the second switch control signal.

6. The conversion circuit of claim 1, wherein
a capacitance value of the first capacitor is equal to a capacitance value of the third capacitance,
a capacitance value of the second capacitor is equal to a capacitance value of the fourth capacitance, and
a sum of the capacitance value of the first capacitor and the capacitance value of the second capacitor is N times of the capacitance value of the first capacitor, wherein N is greater than 1.

7. The conversion circuit of claim 6, wherein
the first end input signal is 1/N times of the input voltage; and
the second end input signal is 1/N times of a difference between the first supply voltage minus the input voltage.

8. The conversion circuit of claim 1, wherein
each of the first capacitor and the second capacitor is a switch capacitor,
the switch capacitor includes a plurality of switch capacitor units connected in parallel, and
each of the switch capacitor units includes the third switch and a plurality of fifth capacitors connected in series, wherein the capacitance value of each of the plurality of fifth capacitors is all the same, all different, or partially different.

9. A conversion circuit for converting a single-ended input to a differential input, wherein the conversion circuit is adapted to a signal converter, and the conversion circuit comprises:
a first conversion sub-circuit, comprising a plurality of switches and a plurality of capacitors, configured to selectively receive a low voltage or an input voltage, and configured to output a first end input signal to the signal converter; and
a second conversion sub-circuit, comprising a plurality of switches and a plurality of capacitors, and electrically connected to the first conversion sub-circuit via the low voltage, and configured to selectively receive the input voltage or a first supply voltage, and configured to output a second end input signal to the signal converter;
wherein
during a first operation period, the first end input signal and the second end input signal are controlled to be the low voltage by the plurality of switches of the first conversion sub-circuit and the second conversion sub-circuit,
during a second operation period after the first operation period, the plurality of switches of the first conversion sub-circuit and the second conversion sub-circuit are operated to make a total quantity of electric charge of the capacitors of the first conversion sub-circuit zero and make the total quantity of electric charge of the capacitors of the second conversion sub-circuit is controlled be a product of the capacitance value of one of the capacitors of the second conversion sub-circuit and the input voltage, and
during a third operation period after the second operation period, the plurality of switches of the first conversion sub-circuit and the second conversion sub-circuit are operated to redistribute the charges of the plurality of capacitors of the first conversion sub-circuit to make the first end input signal be 1/N times of an input signal, and redistribute the charges of the plurality of capacitors of the second conversion sub-circuit to make the second end input signal be 1/N times of the difference between the first supply voltage minus the input voltage.

10. A circuit system, comprising:
a conversion circuit configured to convert a single-ended input to a differential input, wherein the conversion circuit is adapted to a signal converter, and the conversion circuit comprises:
a first capacitor, a second capacitor, a third capacitor, and a fourth capacitor, wherein each of the capacitors has a first end and a second end,
the second end of the first capacitor is electrically connected to the first end of the second capacitor,
the second end of the second capacitor is electrically connected to the first end of the fourth capacitor,
the second end of the second capacitor and the first end of the fourth capacitor are electrically connected to a low voltage,
the second end of the fourth capacitor is electrically connected to the first end of the third capacitor, the second end of the first capacitor and the first end of the second capacitor are configured to output a first end input signal to the signal converter, and the second end of the fourth capacitor and the first end of the third capacitor are configured to output a second end input signal to the signal converter;

a first switch, a second switch, a third switch, and a fourth switch, wherein the first switch is electrically connected to the second end of the first capacitor and the first end of the second capacitor, the second switch is electrically connected to the first end of the first capacitor, the third switch is electrically connected to the second end of the fourth capacitor and the first end of the third capacitor, and the fourth switch is electrically connected to the second end of the third capacitor;

wherein the first switch is configured to selectively control the second end of the first capacitor and the first end of the second capacitor to receive the low voltage or be floating based on a first switch control signal, the third switch is configured to selectively control the second end of the fourth capacitor and the first end of the third capacitor to receive the low voltage or be floating based on the first switch control signal, the second switch is configured to selectively control the first end of the first capacitor to receive the low voltage or an input voltage based on a second switch control signal, and the fourth switch is configured to selectively control the second end of the third capacitor to receive the input voltage or a first supply voltage based on the second switch control signal;

a signal converter, electrically connected to the conversion circuit; and a function circuit, electrically connected to the signal converter.

11. The circuit system of claim 10, wherein
the input voltage is lower than or be equal to the first supply voltage;
the signal converter receives a second supply voltage as a power source; and
the second supply voltage is lower than the first supply voltage.

12. The circuit system of claim 10, wherein during a first operation period,
the first switch is configured to control the second end of the first capacitor and the first end of the second capacitor to receive the low voltage based on the first switch control signal,
the third switch is configured to control the second end of the fourth capacitor and the first end of the third capacitor to receive the low voltage based on the first switch control signal,
the second switch is configured to control the first end of the first capacitor to receive the low voltage based on the second switch control signal, and
the fourth switch is configured to control the second end of the third capacitor to receive the input voltage based on the second switch control signal.

13. The circuit system of claim 12, wherein
during a second operation period after the first operation period,
the first switch is configured to control the second end of the first capacitor and the first end of the second capacitor to be floating based on the first switch control signal,
the third switch is configured to control the second end of the fourth capacitor and the first end of the third capacitor to be floating based on the first switch control signal,
the second switch is configured to control the first end of the first capacitor to receive the low voltage based on the second switch control signal, and
the fourth switch is configured to control the second end of the third capacitor to receive the input voltage based on the second switch control signal.

14. The circuit system of claim 13, wherein
during a third operation period after the second operation period,
the first switch is configured to control the second end of the first capacitor and the first end of the second capacitor be floating based on the first switch control signal,
the third switch is configured to control the second end of the fourth capacitor and the first end of the third capacitor be floating based on the first switch control signal,
the second switch is configured to control the first end of the first capacitor to receive the input voltage based on the second switch control signal, and
the fourth switch is configured to control the second end of the third capacitor to receive the first supply voltage based on the second switch control signal.

15. The circuit system of claim 10, wherein
a capacitance value of the first capacitor is equal to a capacitance value of the third capacitance,
a capacitance value of the second capacitor is equal to a capacitance value of the fourth capacitance, and
a sum of the capacitance value of the first capacitor and the capacitance value of the second capacitor is N times of the capacitance value of the first capacitor, wherein N is greater than 1.

16. The circuit system of claim 15, wherein
the first end input signal is 1/N times of the input voltage; and
the second end input signal is 1/N times of a difference between the first supply voltage minus the input voltage.

17. The circuit system of claim 10, wherein
each of the first capacitor and the second capacitor is a switch capacitor,
the switch capacitor comprises a plurality of switch capacitor units connected in parallel, and
each of the switch capacitor units comprises the third switch and a plurality of fifth capacitors connected in series,
wherein
the capacitance value of each of the plurality of fifth capacitors is all the same, all different, or partially different.

18. The circuit system of claim 10, wherein the function circuit is a control logic circuit, a successive approximation register ADC, or an integrating circuit.

* * * * *